United States Patent [19]

Choi et al.

[11] Patent Number: 5,479,112
[45] Date of Patent: Dec. 26, 1995

[54] LOGIC GATE WITH MATCHED OUTPUT RISE AND FALL TIMES AND METHOD OF CONSTRUCTION

[75] Inventors: Davy H. Choi, Garland; Venugopal Gopinathan, Dallas, both of Tex.

[73] Assignee: Texas Instruments Incorporated, Dallas, Tex.

[21] Appl. No.: 424,765

[22] Filed: Apr. 19, 1995

Related U.S. Application Data

[63] Continuation of Ser. No. 186,726, Jan. 25, 1994, abandoned.

[51] Int. Cl.[6] .............................................. H03K 19/003
[52] U.S. Cl. ................................ 326/34; 326/95; 326/121
[58] Field of Search ................................ 307/443, 451, 307/471, 592; 326/31, 34, 95, 121

[56] References Cited

U.S. PATENT DOCUMENTS

| 4,507,574 | 3/1985 | Seki et al. ........................... 307/451 X |
| 4,575,648 | 3/1986 | Lee ............................................. 307/471 |
| 4,682,055 | 7/1987 | Upadhyayula ..................... 307/443 X |
| 4,739,195 | 4/1988 | Masaki .............................. 307/451 X |
| 4,749,887 | 6/1988 | Sanwo et al. .......................... 307/471 |
| 4,896,059 | 1/1990 | Goodwin-Johansson ........... 307/451 X |

Primary Examiner—David R. Hudspeth
Attorney, Agent, or Firm—W. Daniel Swayze, Jr.; W. James Brady, III; Richard L. Donaldson

[57] ABSTRACT

A logic gate with highly matched output rise and fall times is provided which includes at least one stacked transistor pair (24) and at least one complementary stacked transistor pair (30) connected in parallel across at least one node (NODE 1 and NODE 2).

1 Claim, 2 Drawing Sheets

LOGIC GATE WITH MATCHED OUTPUT RISE AND FALL TIMES AND METHOD OF CONSTRUCTION

This application is a continuation of application Ser. No. 08/186,726 filed Jan. 25, 1994 abandoned.

TECHNICAL FIELD OF THE INVENTION

This invention relates in general to the field of electronic systems and more particularly to an improved logic gate with highly matched output rise and fall times and method of construction.

BACKGROUND OF THE INVENTION

Integrated chip packages are widely used in many industries. An integrated chip package encases a semiconductor chip on which an integrated circuit has been constructed. An integrated chip package can be included in an electronic circuit to perform a wide variety of functions. The functions performed by an integrated chip package depend upon the integrated circuit which has been constructed on the semiconductor chip.

An integrated circuit is composed of a number of integrated circuit elements which might include resistors, capacitors, and transistors. An integrated circuit may include a collection of integrated circuit elements which constitute a logic gate performing a logic function on inputs to the logic gate. Any logic function such as a NOR gate or a NAND gate may be realized by the proper connection of integrated circuit elements. Through the use of numerous logic gates, integrated circuits are capable of performing complex logic functions.

SUMMARY OF THE INVENTION

A need has arisen for an improved logic gate with highly matched output rise and fall times and a method of construction.

In accordance with the present invention, an improved logic gate is provided which substantially eliminates or reduces disadvantages and problems associated with prior logic gates.

According to one embodiment of the present invention, a logic gate is provided which comprises a first stacked transistor pair and a complementary stacked transistor pair. The first stacked transistor pair comprises a first top tier transistor having a first input, a first current path and a second current path. The first input is coupled to a first input signal, and the first current path is coupled to a first node. The first stacked transistor pair also has a first bottom tier transistor which has a second input, a third current path, and a fourth current path. The second input is coupled to a second input signal, the third current path is coupled to the second current path, and the fourth current path is coupled to a second node. The complementary stacked transistor pair comprises a second top tier transistor which has a third input, a fifth current path and a sixth current path. The third input is coupled to the second input signal and the fifth current path is coupled to the first node. The complementary stacked transistor pair also comprises a second bottom tier transistor which has a fourth input, a seventh current path and an eighth current path. The fourth input is coupled to the first input signal, the seventh current path is coupled to the sixth current path, and the eighth current path is coupled to the second node.

According to another embodiment of the present invention, a method of constructing a logic gate with matched output rise and fall times is provided which comprises a number of steps. The first step includes connecting at least one stacked transistor pair between at least one first node and at least one second node in the logic gate. The second step includes connecting at least one complementary stacked transistor pair in parallel with each stacked transistor pair connected in the first step.

BRIEF DESCRIPTION OF THE DRAWINGS

A more complete understanding of the present invention may be acquired by referring to the following description taken in conjunction with the accompanying drawings in which like reference numbers indicate like features and wherein.

DETAILED DESCRIPTION OF THE INVENTION

A conventional CMOS differential exclusive-OR gate comprises four inputs and two outputs. The four inputs comprise two pairs of complementary input signals. Each pair of complementary input signals includes a signal and its complement. One possible designation for the four inputs to a differential exclusive-OR gate is A, $\overline{A}$, B, and $\overline{B}$, where $\overline{A}$ is the complement of A, and $\overline{B}$ is the complement of B. The two outputs of an exclusive-OR gate are complements of one another. The first output represents the exclusive-OR (XOR) of the input signals A and B, and the second output represents the inverse of the exclusive-OR ($\overline{XOR}$) of A and B.

One possible architecture of a conventional CMOS differential exclusive-OR gate is a stacked transistor architecture. In a stacked transistor architecture, NMOS transistors or PMOS transistors are stacked in series such that there is an upper-tier and a lower-tier transistor for each stacked pair. A lower-tier transistor is the one positioned closer to the reference voltage. Commonly, the reference voltage is a positive voltage supply for PMOS transistors and a circuit ground potential for NMOS transistors. An upper-tier transistor is the one positioned farther from the reference voltage. A stacked transistor pair can be used to implement a logic function because the pair only operates as a closed current path given certain inputs on the gates of the transistors.

The different phases of four input signals, A, $\overline{A}$, B, and $\overline{B}$, are received differently by an exclusive-OR gate constructed using a stacked transistor architecture. Specifically, the upper-tier transistors are subject to back gate biasing so that the threshold voltages are higher than the threshold voltages of the lower-tier transistors. Thus, the upper-tier transistors provide less drive compared to the lower-tier transistors. This is true with respect to both NMOS transistors and PMOS transistors. Because some input combinations drive upper-tier transistors while other input combinations drive lower-tier transistors, the rise and fall times of the output of the exclusive-OR gate are not matched for all input combinations. A matched output for the exclusive-OR gate occurs when the rise and fall times of the outputs of the gate do not change with a change in the inputs.

Figure 1:
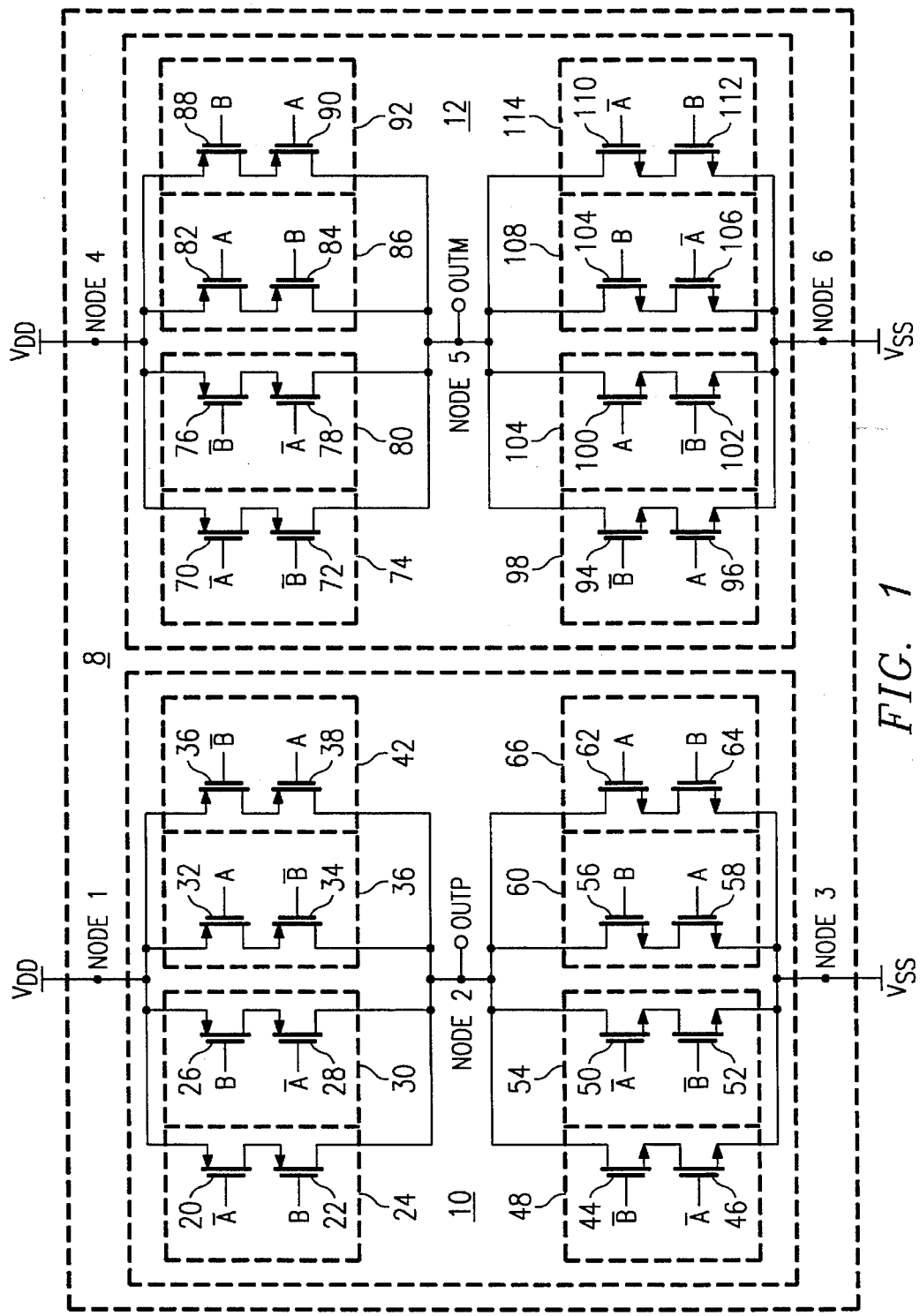
FIG. 1 illustrates a CMOS differential exclusive-OR gate with matched output rise and fall times constructed according to the teachings of the present invention.

FIG. 1 illustrates a CMOS differential exclusive-OR gate with matched output rise and fall times constructed according to the teachings of the present invention. A technical advantage of the present invention is that the thirty-two transistors shown in FIG. 1 need only be one-half the size of the transistors used in a conventional CMOS differential exclusive-OR gate. Thus, the circuit illustrated in FIG. 1 includes twice as many transistors which occupy an identical semiconductor area as that needed for a conventional CMOS exclusive-OR gate. The exclusive-OR gate of FIG. 1 includes an XOR circuit 10 and a $\overline{XOR}$ circuit 12. Input signal A and input signal B comprise the logic inputs for which an exclusive-OR output is desired. The input signals $\overline{A}$ and $\overline{B}$ comprise the inverse of input signal A and input signal B, respectively. The voltage level of OUTP represents the output of the XOR circuit 10.

The XOR circuit 10 comprises a PMOS transistor 20 and a PMOS transistor 22. PMOS transistor 20 and PMOS transistor 22 comprise a stacked transistor pair 24. PMOS transistor 20 and PMOS transistor 22 each comprise a source, a gate, and a drain. In general, field effect transistors comprise a control input referred to as a gate and a pair of current nodes referred to as a source and a drain. The source of PMOS transistor 20 is coupled to NODE 1, the gate of PMOS transistor 20 is connected to an input signal $\overline{A}$, and the drain of PMOS transistor 20 is connected to the source of PMOS transistor 22. The gate of PMOS transistor 22 is connected to an input signal B, and the drain of PMOS transistor 22 is connected to NODE 2.

A PMOS transistor 26 and a PMOS transistor 28 comprise a complementary stacked transistor pair 30 which is a complement to the stacked transistor pair 24. A complementary stacked transistor pair is a pair of transistors connected in series with one another and connected in parallel with a stacked transistor pair where the connections to the control inputs are switched with respect to the transistors in the stacked transistor pair. PMOS transistor 26 and PMOS transistor 28 each comprise a gate, a source and a drain. PMOS transistor 26 has its source connected to NODE 1, its gate connected to input signal B and its drain connected to the source of PMOS transistor 28. PMOS transistor 28 has its gate connected to input signal $\overline{A}$, and its drain connected to NODE 2. PMOS transistor 22 and PMOS transistor 28 are upper-tier transistors, and PMOS transistor 20 and PMOS transistor 26 are lower-tier transistors. As discussed above, PMOS transistor 20 and PMOS transistor 26 are lower-tier transistors because they are closer to $V_{DD}$. Upper-tier transistors, PMOS transistors 22 and 28, have higher threshold voltages than PMOS transistors 20 and 22 because the sources of PMOS transistors 20 and 26 are not connected directly to $V_{DD}$.

PMOS transistor 32 and PMOS transistor 34 comprise another stacked transistor pair 36. PMOS transistor 36 and PMOS transistor 38 comprise a complementary stacked transistor pair 42 which is a complement to the stacked transistor pair 36. PMOS transistor 32, PMOS transistor 34, PMOS transistor 36, and PMOS transistor 38 are connected in a manner similar to the connection of PMOS transistors 20, 22, 26, and 28 with the exception of the connection of the gates. The gate of PMOS transistor 32 is connected to input signal A, and the gate of PMOS transistor 34 is connected to the input signal $\overline{B}$. The gate of PMOS transistor 36 is connected to input signal $\overline{B}$, and the gate of PMOS transistor 38 is connected to input signal A.

An NMOS transistor 44 and an NMOS transistor 46 comprise a stacked transistor pair 48. NMOS transistor 44, and NMOS transistor 46 comprise a drain, a gate, and a source. The drain of the NMOS transistor 44 is connected to NODE 2. The gate of the NMOS transistor 44 is connected to input signal $\overline{B}$, and the source of the NMOS transistor 44 is connected to the drain of NMOS transistor 46. The gate of NMOS transistor 46 is connected to input signal $\overline{A}$, and the source of NMOS transistor 46 is connected to NODE 3.

An NMOS transistor 50 and an NMOS transistor 52 comprise a complementary stacked transistor pair 54 which is a complement to the stacked transistor pair 48. NMOS transistor 50 and NMOS transistor 52 each comprise a drain, a gate, and a source. The drain of NMOS transistor 50 is connected to NODE 2. The gate of NMOS transistor 50 is connected to the input signal $\overline{A}$, and the source of NMOS transistor 50 is connected to the drain of NMOS transistor 52. The gate of NMOS transistor 52 is connected to input signal $\overline{B}$, and the source of NMOS transistor 52 is connected to NODE 3. Similar to the description above, NMOS transistor 44 and NMOS transistor 50 comprise upper-tier transistors because they are farther from circuit ground potential $V_{SS}$. NMOS transistor 46 and NMOS transistor 52 comprise lower-tier transistors because they are closer to circuit ground potential $V_{SS}$.

NMOS transistor 56 and NMOS transistor 58 comprise a stacked transistor pair 60. NMOS transistor 62 and NMOS transistor 64 comprise a complementary stacked transistor pair 66 which is a complement to the stacked transistor pair 60. The stacked transistor pair 60 and the complementary stacked transistor pair 66 are connected similar to the stacked transistor pair 48 and the complementary stacked transistor pair 54. The difference is the connection of the gates of the NMOS transistors. The gate of NMOS transistor 56 is connected to input signal B, and the gate of NMOS transistor 58 is connected to input signal A. The gate of NMOS transistor 62 is connected to input signal A, and the gate of NMOS transistor 64 is connected to input signal B. A power supply $V_{DD}$ is connected to NODE 1. Circuit ground potential designated $V_{SS}$ is connected to NODE 3.

The $\overline{XOR}$ circuit 12 comprises sixteen transistors connected the same manner as those in the XOR circuit 10 except for the connections of the gates of the transistors. The voltage level of OUTM is the output of the $\overline{XOR}$ circuit 12 and represents the inverse exclusive-OR of the input signals A and B. A PMOS transistor 70 and a PMOS transistor 72 comprise a stacked transistor pair 74. The gate of PMOS transistor 70 is connected to input signal $\overline{A}$, and the gate of PMOS transistor 72 is connected to input signal $\overline{B}$. A PMOS transistor 76 and a PMOS transistor 78 comprise a complementary stacked transistor pair 80 which is a complement to the stacked transistor pair 74. The gate of PMOS transistor 76 is connected to input signal $\overline{B}$, and the gate of PMOS transistor 78 is connected to input signal $\overline{A}$.

A PMOS transistor 82 and a PMOS transistor 84 comprise a stacked transistor pair 86. The gate of PMOS transistor 82 is connected to input signal A, and the gate of PMOS transistor 84 is connected to input signal B. A PMOS transistor 88 and a PMOS transistor 90 comprise a complementary stacked transistor pair 92 which is a complement to the stacked transistor pair 86. The gate of PMOS transistor 88 is connected to input signal B, and the gate of PMOS transistor 90 is connected to input signal A. The stacked transistor pair 74, the complementary stacked transistor pair 80, the stacked transistor pair 86, and the complementary stacked transistor pair 92 are connected in parallel between NODE 4 and NODE 5.

An NMOS transistor 94 and an NMOS transistor 96 comprise a stacked transistor pair 98. The gate of NMOS transistor 94 is connected to input signal $\overline{B}$, and the gate of NMOS transistor 96 is connected to input signal A. An NMOS transistor 100 and an NMOS transistor 102 comprise a complementary stacked transistor pair 104 which is a complement to the stacked transistor pair 98. The gate of NMOS transistor 100 is connected to input signal A, and the gate of NMOS transistor 102 is connected to input signal $\overline{B}$.

NMOS transistor 104 and NMOS transistor 106 comprise a stacked transistor pair 108. The gate of NMOS transistor 104 is connected to input signal B, and the gate of NMOS transistor 106 is connected to input signal $\overline{A}$. An NMOS transistor 110 and an NMOS transistor 112 comprise a complementary stacked transistor pair 114 which is a complement to the stacked transistor pair 108. The gate of NMOS transistor 110 is connected to input signal $\overline{A}$, and the gate of NMOS transistor 112 is connected to input signal B. The stacked transistor pair 98, the complementary stacked transistor pair 104, the stacked transistor pair 108, and the complementary stacked transistor pair 114 are connected in parallel between NODE 5 and NODE 6. The power supply $V_{DD}$ is connected to NODE 4, and circuit ground potential designed $V_{SS}$ is connected to NODE 6.

The designation of pairs of transistors as a stacked transistor pair or as a complementary stacked transistor pair could be reversed with respect to each set of transistors. For example, stacked transistor pair 24 and complementary stacked transistor pair 30 comprise a set of transistors. The stacked transistor pair 24 could be designated a complementary stacked transistor pair, and the complementary stacked transistor pair 30 could be designated a stacked transistor pair. The naming is important only that a set of transistors includes one stacked transistor pair, and one complementary stacked transistor pair. A complementary stacked transistor pair comprises two transistors connected in series as does a stacked transistor pair, and the complementary stacked transistor pair is connected in parallel with the stacked transistor pair. The complementary stacked transistor pair is a complement to the stacked transistor pair because the connections of the control inputs are switched. As can be seen in FIG. 1, the exclusive-OR gate 8 includes eight sets of transistors, each set comprising one stacked transistor pair and one complementary stacked transistor pair.

In operation, the XOR circuit 10 and the $\overline{XOR}$ circuit 12 operate on the input signals A, $\overline{A}$, B, and $\overline{B}$ to produce both the logical XOR of input signals A and B and the logical inverse of the XOR ($\overline{XOR}$) of input signals A and B. The XOR circuit 10 produces an output OUTP which is the logical XOR of the input signals A and B. Thus, OUTP represents ($A\overline{B}+\overline{A}B$). The following table sets forth the logic function performed by the XOR circuit 10.

TABLE 1

| A | $\overline{A}$ | B | $\overline{B}$ | OUTP |
|---|---|---|---|---|
| L | H | L | H | L |
| L | H | H | L | H |
| H | L | L | H | H |
| H | L | H | L | L |

The $\overline{XOR}$ circuit 12 operates to produce an output which is $\overline{XOR}$ of input signals A and B. Thus, the output represents ($AB+\overline{A}\overline{B}$). The following table illustrates the logic function performed by the $\overline{XOR}$ circuit 12.

TABLE 2

| A | $\overline{A}$ | B | $\overline{B}$ | OUTM |
|---|---|---|---|---|
| L | H | L | H | H |
| L | H | H | L | L |
| H | L | L | H | L |
| H | L | H | L | H |

These logic functions are realized because the PMOS transistors turn on and conduct current when their inputs are at a logic low represented by an L in the table. The NMOS transistors turn on and conduct current when their inputs are a logical high represented by an H in the table.

A technical advantage of constructing a CMOS differential exclusive-OR gate according to the teachings of the present invention, as illustrated in FIG. 1, is the matched output rise and fall times. Note that each input signal is fed into both an upper-tier and lower-tier transistor. In this way, the output drive due to any input combination will be identical. The use of sets of transistors which include a stacked transistor pair and a complementary stacked transistor pair ensures that the input signals are connected such that a change in the input signals will not change the output rise and fall time. Thus, OUTP and OUTM provide output signals for which the rise and fall times do not change when the input signal combination changes.

Another technical advantage of the present invention is that the silicon area required for a logic gate constructed according to the teachings of the present invention is identical to the silicon area required for a conventional logic gate. Thus, the seemingly more complicated arrangement of transistors in which sets of transistors comprising a stacked transistor pair and a complementary stacked transistor pair only requires a different contact programming of the leads to the logic gate and not more semiconductor area.

Figure 2:
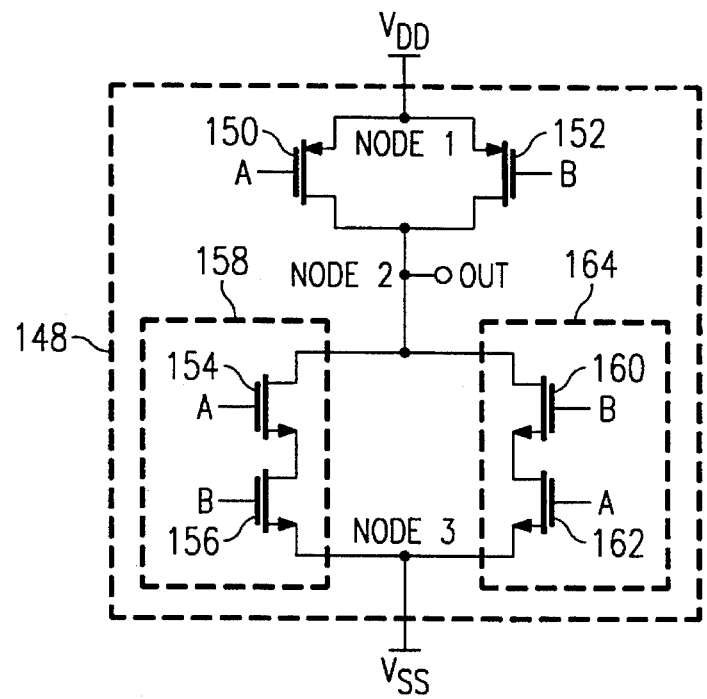
FIG. 2 illustrates a CMOS NAND gate constructed according to the teachings of the present invention.

FIG. 2 illustrates a NAND gate 148 constructed according to the teachings of the present invention. Input signal A and input signal B comprise the logic inputs for which a NAND output is desired. A PMOS transistor 150 comprises a source, a gate, and a drain. The source of PMOS transistor 150 is connected to NODE 1, the gate of PMOS transistor 150 is connected to input signal A, and the drain of PMOS transistor 150 is connected to NODE 2. A PMOS transistor 152 comprises a source, a gate, and a drain. The source of PMOS transistor 152 is connected to NODE 1, the gate of PMOS transistor 152 is connected to input signal B, and the drain of PMOS transistor 152 is connected to NODE 2. The voltage level OUT represents the output of the NAND gate 148. A positive power supply $V_{DD}$ is connected to NODE 1, and circuit ground potential $V_{SS}$ is connected to a NODE 3.

An NMOS transistor 154 and an NMOS transistor 156 comprise a stacked transistor pair 158. NMOS transistor 154 and NMOS transistor 156 each comprise a drain, a gate and a source. The drain of NMOS transistor 154 is connected to NODE 2, the gate of NMOS transistor 154 is connected to input signal A, and the source of NMOS transistor 154 is connected to the drain of NMOS transistor 156. The gate of NMOS transistor 156 is connected to input signal B, and the source of NMOS transistor 156 is connected to NODE 3. An NMOS transistor 160 and an NMOS transistor 162 comprise a complementary stacked transistor pair 164 which is a complement to the stacked transistor pair 158. The complementary stacked transistor pair 164 is connected in parallel with the stacked transistor pair 158 across NODE 2 and NODE 3. The NMOS transistor 160 and the NMOS transistor 162 are connected similar to NMOS transistor 154 and NMOS transistor 156 except for the gates. The gate of NMOS transistor 160 is connected to input signal B, and the gate of NMOS transistor 162 is connected to input signal A.

In operation, the NAND gate 148 produces an output OUT which is the logical NAND of the input signals A and B. The following table illustrates the logic function performed by the NAND gate 148.

TABLE 3

| A | B | OUT |
|---|---|-----|
| L | L | H |
| L | H | H |
| H | L | H |
| H | H | L |

This logic function is realized because the PMOS transistors turn on and conduct current when their inputs are at a logic low represented by an L in the table. The NMOS transistors turn on and conduct current when their inputs are a logical high represented by an H in the table. Thus, NODE 2 is connected to NODE 3 only when both input signal A and input signal B are a logical high.

Figure 3:
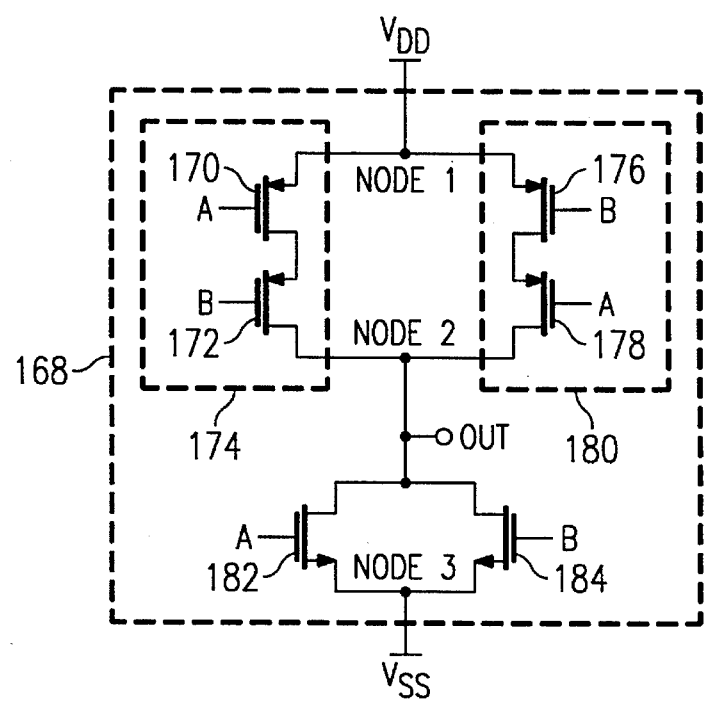
FIG. 3 illustrates a CMOS NOR gate constructed according to the teachings of the present invention.

FIG. 3 illustrates a NOR gate 168 constructed according to the teachings of the present invention. Input signal A and input signal B comprise the logic inputs for which a NOR output is desired. The NOR gate 168 comprises a PMOS transistor 170 and a PMOS transistor 172 which together comprise a stacked transistor pair 174. The PMOS transistor 170 and the PMOS transistor 172 each comprise a source, a gate and a drain. The source of PMOS transistor 170 is connected to NODE 1, the gate of PMOS transistor 170 is connected to input signal A, and the drain of PMOS transistor 170 is connected to the source of PMOS transistor 172. The gate of PMOS transistor 172 is connected to input signal B, and the drain of PMOS transistor 172 is connected to NODE 2. A PMOS transistor 176 and a PMOS transistor 178 comprise a complementary stacked transistor pair 180 which is a complement to the stacked transistor pair 174. PMOS transistor 176 and PMOS transistor 178 are connected similar to PMOS transistor 170 and PMOS transistor 172 except for the gates. The gate of PMOS transistor 176 is connected to input signal B, and the gate of PMOS transistor 178 is connected to input signal A. The stacked transistor pair 174 and the complementary stacked transistor pair 180 are connected in parallel across NODE 1 and NODE 2. The voltage level OUT represents the logical NOR of input signals A and B and is the output of the NOR gate 168. A positive power supply $V_{DD}$ is connected to NODE 1, and circuit ground potential $V_{SS}$ is connected to a NODE 3.

An NMOS transistor 182 and an NMOS transistor 184 are connected in parallel across NODE 2 and NODE 3. NMOS transistor 182 and NMOS transistor 184 each comprise a drain, a gate, and a source. The drain of NMOS transistor 182 is connected to NODE 2, the gate of NMOS transistor 182 is connected to input signal A, and the source of NMOS transistor 182 is connected to NODE 3. The drain of NMOS transistor 184 is connected to NODE 2, the gate of NMOS transistor 184 is connected to input signal B, and the source of NMOS transistor 184 is connected to NODE 3.

In operation, NOR gate 168 produces the logical NOR of input signals A and B. The voltage level at NODE 2 represents the logical NOR of the input signals A and B. The following table sets forth the logical function of the NOR gate 168.

TABLE 4

| A | B | OUT |
|---|---|-----|
| L | L | H |
| L | H | L |
| H | L | L |
| H | H | L |

The NOR gate 168 produces the logical NOR of the input signals A and B because of the function of the PMOS and NMOS transistors. The NMOS transistors turn on only when the input signal connected to the gate is a logical high and the PMOS transistors turn on only when the input signal connected to the gate is a logical low. Thus, NODE 2 is connected to circuit ground at NODE 3 when either input signal A or input signal B is a logical high. NODE 2 is connected to $V_{DD}$ only when both input signal A and input signal B are logical lows.

Although the present invention has been described in detail, it should be understood that various changes, substitutions and alterations can be made hereto without departing from the spirit and scope of the present invention as defined by the appended claims.

What is claimed is:

1. A CMOS differential exclusive-OR gate with highly matched output rise and fall times, comprising:
  a first stacked group of four transistors which comprises:
    a first upper-tier transistor comprising a first upper input, a first upper current node and a second upper current node, the first input to receive an inverse of a first input signal; and
    a second upper-tier transistor comprising a second upper input and a third upper current node, the second upper input to receive a second signal, and the second upper current node coupling the first upper-tier transistor to the second upper tier transistor;
    a first lower-tier transistor comprising a first lower input, a first lower current node and a second lower current node, the first lower input to receive an inverse of the second input signal, the first lower current node coupled to the third upper current node; and
    a second lower-tier transistor comprising a second lower input and a third lower current node, the second lower input to receive the inverse of the first input signal;
  a complementary stacked group of four transistors which comprises;
    a first complementary upper-tier transistor comprising a first complementary input, a first complementary current node and a second complementary current node, the first complementary input to receive the second input signal, and the first complementary current node coupled to the first current node; and
    a complementary second upper-tier transistor comprising a second complementary input, and a third complementary current node coupled to the second complementary current node, and the second complementary input to receive an inverse of the first input signal;

a first complementary lower-tier transistor comprising a first complementary lower input, a first complementary lower-tier current node coupled to the third current node, and an second complementary lower-tier current node, the first complementary lower-tier input to receive the inverse of the first input signal; and a second complementary lower-tier transistor comprising a second complementary lower-tier input and a third complementary lower-tier current node coupled to the third lower-tier current node, the second complementary lower-tier input to receive the inverse of the second signal.

* * * * *